United States Patent [19]
Bush et al.

[11] Patent Number: 5,272,651
[45] Date of Patent: Dec. 21, 1993

[54] CIRCUIT SIMULATION SYSTEM WITH WAKE-UP LATENCY

[75] Inventors: Steve Bush, San Jose; Robert Shur, Los Altos, both of Calif.

[73] Assignee: VLSI Technology, Inc., San Jose, Calif.

[21] Appl. No.: 632,895

[22] Filed: Dec. 24, 1990

[51] Int. Cl.$^5$ .............................................. G06F 15/20
[52] U.S. Cl. ..................................... 364/578; 364/488
[58] Field of Search ........................ 364/578, 488, 490; 395/500

[56] References Cited

U.S. PATENT DOCUMENTS

| | | | |
|---|---|---|---|
| 4,751,637 | 6/1988 | Catlin | 395/500 |
| 4,775,950 | 10/1988 | Terada et al. | 364/578 |
| 4,815,024 | 3/1989 | Lewis | 364/802 |
| 4,866,663 | 9/1989 | Griffin | 364/900 |
| 4,872,125 | 10/1989 | Catlin | 364/578 |
| 4,901,260 | 2/1990 | Lubachevsky | 364/578 |
| 4,965,758 | 10/1990 | Sherman | 364/578 |
| 5,062,067 | 10/1991 | Schaefer et al. | 364/488 |
| 5,068,812 | 11/1991 | Schaefer et al. | 364/578 |

OTHER PUBLICATIONS

Horowitz et al., "Data Structures", 1986 pp. 160–173.
Ulrich; "Serial/Parallel Event Scheduling for the Simulation of Large System"; 1968 ACM National Conference.
Ulrich; "Exclusive Simulation of Activity in Digital Networks"; 1969.

Primary Examiner—Jack B. Harvey
Assistant Examiner—Ellis B. Ramirez
Attorney, Agent, or Firm—Clifton L. Anderson

[57] ABSTRACT

An event-driven logic simulator provides for future evaluation events. Evaluation latencies are assigned to respective inputs of components based on component type. At least some of these latencies are positive and finite. When a signal status event specifies a change at an input associated with a positive latency, the function for the component is not evaluated at the present time. Instead, the evaluation is postponed to a future time equal to the present time plus the assigned latency. The evaluation is thus latent until the scheduled time becomes present. When multiple evaluation events are indicated for a common component output, a queue manager resolves the conflicts by discarding all but one of the evaluation events for that output. This approach minimizes redundant and superfluous evaluations during circuit simulation.

9 Claims, 4 Drawing Sheets

CIRCUIT SIMULATION SYSTEM WITH WAKE-UP LATENCY

BACKGROUND OF THE INVENTION

The present invention relates to integrated circuits and, more particularly, to logic simulation of integrated circuits. A major objective of the present invention is to provide for more efficient event-driven logic simulation of very large scale integrated circuits.

Much of modern technological progress is identified with miniaturization of integrated circuits. Miniaturization allows for increased functionality by increasing the number of logic elements circuits that can be integrated onto a single integrated circuit device. Recently, semiconductor processing has permitted an evolution from large scale integration (LSI) to very large scale integration (VLSI) circuits. The increased integration has provided for improved performance.

However, to provide this increased integration and performance economically, it is necessary to avoid manufacturing defectively designed circuits. This avoidance is accomplished by simulating the performance of a circuit design through what is called "logic simulation". Logic simulation involves construction of a model of an integrated circuit, and the evaluation of the response of the model to simulated input events.

There are two basic approaches to logic simulation: levelized logic simulation and event-driven logic simulation. Both approaches construct a circuit model which specifies components of the circuit and the signals that define the relations among these components and between the circuit and an incorporating system. Both approaches specify changes in selected signals to determine the effects of those changes on other signals. The effects are defined by functions associated with respective components having the selected signals as inputs and the affected signals as outputs.

In levelized logic simulations, the effect of a specified signal change is evaluated for the entire circuit. Once this evaluation is complete, a second signal change can be introduced for evaluation. Levelized logic simulation requires that the circuit model order the components so that components receiving a signal as inputs are evaluated after the component generating the signal as an output.

There are three basic limitations of levelized logic simulations. First, the circuit must be analyzed to order the components. Second, because components must be ordered, circuits with feedback loops require special evaluation techniques. Third, levelized logic simulations tend to require superfluous evaluations of components whose inputs have not changed. Various strategies have been employed, with varying degrees of effectiveness, to avoid time-consuming evaluations of components that cannot be affected by a given signal change. However, these have met with only limited success.

Event-driven logic simulation addresses all three of these disadvantages. First, components and signals need not be ordered. Second and therefore, feedback loops can be handled routinely. Third, only components with changed inputs are evaluated.

One of the tradeoffs is that event-driven logic simulations can generate a large number of "uninteresting" events which are evaluated as a matter of course. These superfluous evaluations waste valuable computer time. The present invention is directed to minimizing these superfluous evaluations so as to reduce the time and complexity of event-driven logic simulations.

In a typical event-driven simulation, the circuit model is represented by a signal list and a component list, the latter being conveniently separated into a component instance list and a component type list. The signal list is a database in which the records (usually, rows when the list is represented as a table) correspond to respective circuit signals. Typically, the fields (column heading) include the signal name, the source of the signal, the signal destinations, the current status of the signal, and the time at which the current status was most recently attained.

The component instance list is a database in which the records correspond to components. Typically, the following fields are included in the component instance list: component name, component type, the signals received at its inputs, and the signals generated at its outputs. The component type entry is used to address the component type list, which describes the function performed by the component. The component function can specify timing relationships as well as the logical relationship between inputs and outputs. The timing relationship can specify how long it will take an input change to be reflected at an output. For example, a function for an inverter can specify that a change in the input to an inverter will cause the inverter output to undergo the opposing change two nanoseconds (ns) later. This timing relationship can be specified for each input-output pair.

The inputs to the circuit characterized by the signal and component lists can be specified in an event queue. This queue specifies a chronological series of events, including signal status events. A signal status event specifies a signal to be changed, a value or status to which the specified signal is to be changed, and a simulation time at which the specified change is to occur.

A queue manager can select the earliest event, i.e., the one with the earliest specified time, for processing. The signal name specified by the selected signal event is used to address the signal list. The specified new signal status, e.g., a logic high (1), a logic low (0), a high-impedance state (Z), or possibly an uncertain status (U), is recorded in the status field for the appropriate record. In addition, the present simulation time is recorded in the "most-recent-transition" (MRT) time entry in the signal's record. The signal list also specifies the component(s) which serves (serve) as the signal's destination; a signal can have more than one destination.

The destination specified in the specified signal's record is used to select the destination component's record in the component instance list. The component instance list specifies which input receives the changed signal. It also specifies which signals are received by other inputs of the component. The component instance list also specifies the type of the destination component.

The component type information is used to address the component type list which specifies the function for the component. This function is scheduled for evaluation at the present simulation time, unless a flag is set indicating that no evaluation is to follow a change at the destination input. For example, changes in data inputs to flip-flops do not require evaluation since the data inputs do not affect flip-flop outputs except when a clock signal enables the flip-flop. Therefore, evaluation of the flip-flop occurs when a signal status event specifies the required signal change in the clock input to the flip-flop.

The evaluation is scheduled for the present time, rather than executed immediately. Other presently scheduled signal status events are processed before any presently scheduled evaluation events. This strategy is designed to handle cases where two inputs of a component change at the same time. Evaluating between simultaneous input changes generally results in misleading output evaluations. Postponing the evaluation insures that all "recent" signal data is available for the evaluation. In addition, this strategy allows one of the scheduled evaluations to be dropped, minimizing the time required for evaluation.

Despite such strategies such as scheduling present evaluations after present signal status events, event-driven logic simulations can readily generate superfluous events and evaluations. "Uninteresting" transition artifacts can be generated when two inputs of a component change at slightly different times. For example, in the worst case input changes could be received at thirty-two slightly different times by a 16+16-bit multiplier. A simulator would have to perform 32 complex evaluations, only the last of which is really of interest. Each of the other 31 evaluations would generate up to 32 new statuses at the output of the multiplier (assuming it had 32 outputs). Each of these 32 outputs could affect one or more other components, depending on fanouts from the multiplier. Each component receiving a multiplier output could require further evaluations.

Component evaluation is computationally intensive. Minimizing superfluous evaluations and the chain reaction they can cause would greatly increase the efficiency of event-driven simulations. This would reduce the time and cost required for circuit simulation, in turn, making circuit design more cost effective.

SUMMARY OF THE INVENTION

The present invention provides for the scheduling of evaluation events at future simulation times. These latent evaluation events will wake up the model for a specified component for evaluation. However, if before a latent evaluation event is executed, another evaluation event specifying the same component is scheduled, one of the two redundant evaluation events can be discarded.

Prior event-driven simulation strategies only schedule evaluation events for the present simulation time. (Of course, they were performed in the real-time future. Herein, "time" refers to simulation time, unless otherwise indicated).

Future scheduling of evaluation events permits a later status event to occur before the evaluation called for by a prior status event has been executed. When the evaluation event called for by the second status event is scheduled, a queue manager can then determine whether one of the first and second evaluations is superfluous. Thus, the present invention provides for discharging some superfluous evaluations that could not be discarded using prior art approaches.

The present invention provides for a computer-based logic simulator. A model of the circuit is constructed and recorded in memory. The model can include a component list specifying the inputs and outputs of each component and the functional relationship between the inputs and outputs. An evaluation latency is assigned to each evaluation event. Preferably, this latency is assigned to each input of each component type. However, provision can be made for assigning different latencies to different component instances of the same component type.

A conventional signal list can be used to record and determine present signal statuses, the time at which each present status was most recently attained, and the destinations of the signals. It is also convenient to indicate the source of a signal in the signal list. The statuses in the signal list are typically, logic high "1", logic low "0", tri-state "Z", and uncertain "U".

Since the signal list specifies signal destinations, it can be used to locate components that receive a signal as an input. The component list can determine which input receives the signal as its input. Thus, a status event effects a change in signal status which in turn effects a change in the status of a component input.

In a single component system, the reference to signals can be bypassed conveniently. Events can specify inputs directly, without reference to signals. Even in multi-component circuits, the relations between the inputs and outputs of various components can be specified in a variety of ways.

A component list can be used to specify component inputs and outputs. When multiple instances of a single component type are employed in a circuit or when a circuit includes components from a standard cell library, it is most convenient to separate the component list into a component instance list and a component type list. The component instance list matches signals to inputs and outputs. The component type list specifies component functions and latencies. Specifying latencies by component instance is also possible, but more cumbersome. The present invention provides that a component instance list can specify the default latency provided by the component type or override the default by specifying another latency.

An event queue stores present and future events. Both status events, which dictate changes in signal or input statuses, and evaluation events are scheduled in the queue. As provided by the present invention, evaluation events as well as status events can be scheduled for future times.

The foregoing memory items (the queue and the lists) are managed by a computer processor, as programmed in accordance with the present invention. Functionally, the program can be divided between a queue manager module and a function evaluator module. The queue manager tends to be more active, performing many simple data manipulations. The function evaluator acts less but performs computationally intensive evaluations in accordance with component functions.

The present invention provides that the function evaluator can adjust the time of reference of an evaluation by the associated evaluation latency. This permits an output signal status event to be scheduled for the same future time that it would have been scheduled had the evaluation been performed "concurrently" with the signal change that called for the evaluation.

The queue manager sorts the queue chronologically. The present invention provides for a queue manager that can schedule and manage future evaluation events. Within a time, it can prioritize signal events over evaluation events and among signal events and among evaluation events. The queue manager can select a present event for processing. In response to a status event, the queue manager can update the signal list and determine signal destinations from the signal list. The queue manager can associate signals with component inputs using the component instance list, and use the component instance list to identify component types. The component types can be used to determine latencies. During an evaluation event, the queue manager directs the function evaluator to perform the function characterizing the appropriate component type.

The queue manager also resolves priorities between potentially redundant evaluation events. Normally, only one evaluation pertaining to a component should be scheduled at any given time. A more sophisticated analysis can permit a component's function to be severed into independent functions affecting separate outputs, so that multiple evaluations might be a fruitful approach. However, successive computations of the status of a single output should be avoided by conflict management by the queue manager.

The present invention is particularly applicable to arithmetic components where inputs arrive at staggered times, while only one output pattern is of interest. Without the present invention, the output of the unit would be evaluated each time an input is received. If latencies are assigned to the inputs that are longer than the degree of stagger between the inputs, the output will not be evaluated until all the relevant inputs are received. The useless premature evaluations are avoided. Preferably, the latency is less than the overall delay introduced by the unit to avoid obscuring a subsequent arithmetic operation.

The present system involves very little additional memory and processing overhead. Furthermore, it is quite compatible with prior art event-driven logic simulation approaches. Accordingly, it preserves their advantages, while gaining with certain commonplace component types. These and other features and advantages of the present invention are apparent from the description below with reference to the following drawings.

DESCRIPTION OF THE PREFERRED EMBODIMENT

Figure 1:
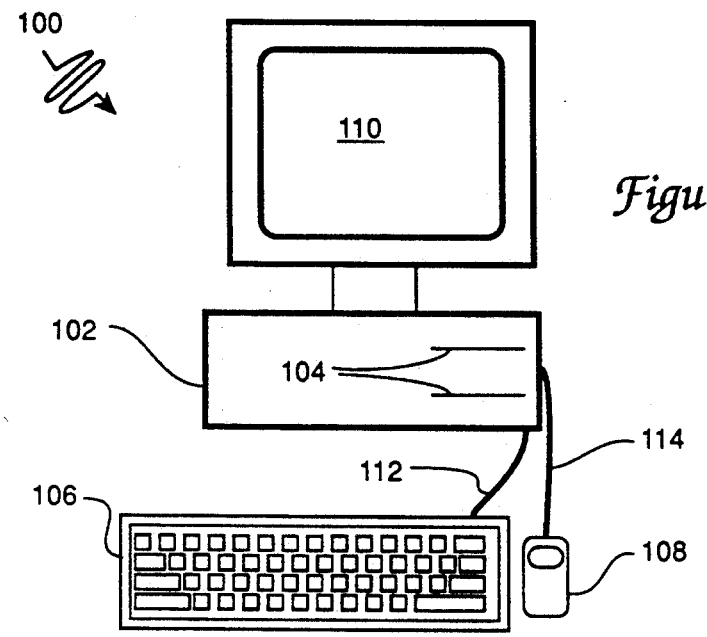
FIG. 1 is a schematic diagram of a computer-based simulation system embodying the present invention.

The present invention is embodied in a computer-based simulation system 100 having a computer 102, including floppy disk drives 104, a keyboard 106, a mouse 108, and a video monitor 110, as shown in FIG. 1. Keyboard 106 communicates with computer 102 via its cable 112, while mouse 108 communicates to computer via its cable 114. Computer 102 controls the information displayed on monitor 110 via another cable, not shown.

Figure 2:
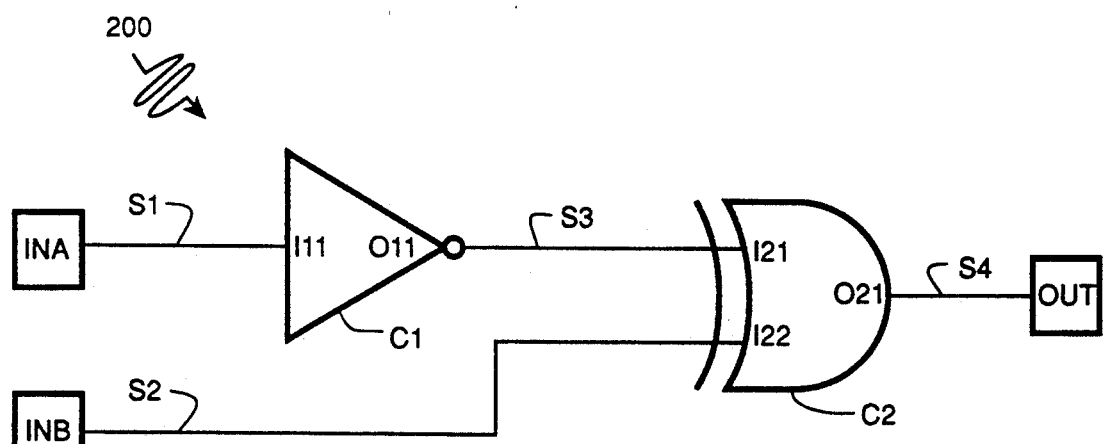
FIG. 2 is a circuit design which is evaluated using the system of FIG. 1.

The purpose of simulation system 100 is to simulate an integrated circuit, such as circuit 200, represented in FIG. 2. Circuit 200 is designed to test whether or not a signal S2 properly tracks another signal S1. Circuit 200 includes two components, an inverter C1 and an exclusive-OR (XOR) gate C2. Signal S1 is provided from a pin INA as a first circuit input to circuit 200, and is also received at inverter input I11. The output O11 of inverter C1 provides a signal S3 to an output pin OUT. This signal is received at a first input I21 of XOR gate. Signal S2 is provided from an input pin INB as a second circuit input signal to circuit 200, and is also provided at a second input I22. The XORed result is provided at the output O21 of XOR gate C2.

Circuit 200 can be modeled on two different scales. On the smaller scale, circuit 200 can be modeled with two components and four signals. Inverter C1 can be characterized by the logic function $O1=\overline{I1}$. However, this relationship does not hold immediately after a transition at input I1, since there is an input-to-output interval, 2 ns in this case, associated with inverter C1. Accordingly, the component list further characterizes input-to-output intervals $T^i jk$, where i is a component index, j is an input index, and k is an output index. Inverter C1 has one input/output pair, so its sole interval is $T^1 11=2$.

XOR gate C2 is characterized by the logic function $I21 \oplus I22$ and input-to-output intervals $T^2 11=10$ and $T^2 21=12$. This simulation function allows S4 to be computed from S2 and S3 and thus from S2 and S1.

On the larger scale, circuit 200 can be treated as a single component having two inputs, S1 and S2 and one output S4. In this case the logic function is $S4=\overline{S1}\oplus S2$. Both input-to-output intervals are 12 ns. The advantage of the larger scale is that a complex circuit can be modelled with fewer components. The disadvantage of the larger scale is that it can result in an oversimplification of the circuit so that the resulting simulation is less accurate. Below, the smaller scale model of circuit 200 is used to illustrate the operation of simulation system 100.

Figure 3:
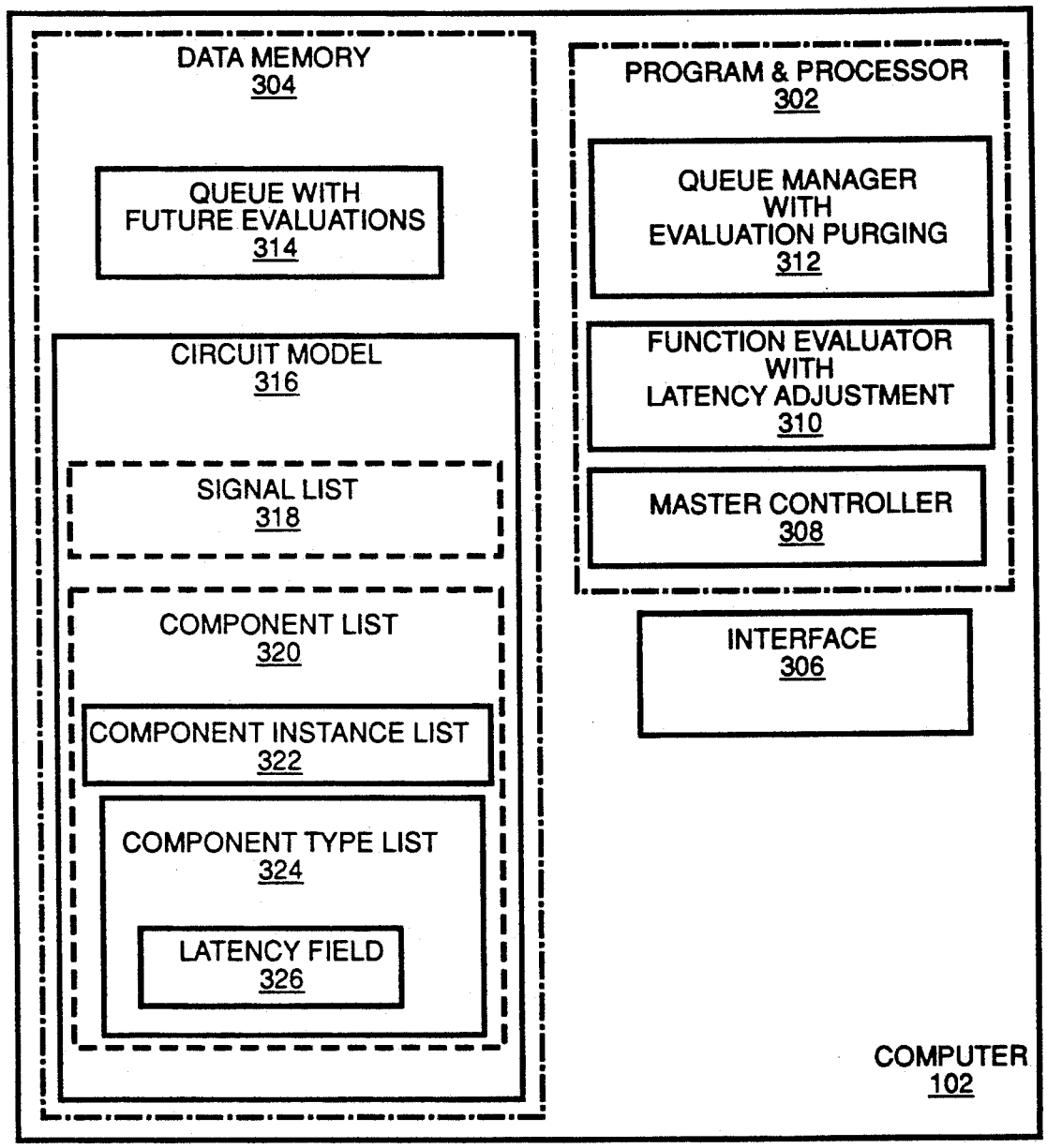
FIG. 3 is a functional diagram of a computer of the simulation system of FIG. 1.

Computer 102 houses a program 302, which herein is taken to include a microprocessor for executing program 302, data memory 304, and an interface 306, as shown in FIG. 3. Interface 306 manages the flow of information from keyboard 106 and mouse 108 and to monitor 110. Program 302 is functionally divided into a master controller 308, a function evaluator 310 and a queue manager 312.

Data memory 304 includes an internal hard disk and internal random access memory (RAM), not independently shown. Information is shuttled between RAM and hard disk by master controller 308 as required. Memory 304 is functionally divided into an event queue 314 and a circuit model 316 which includes a signal list 318 and a component list 320. Component list 320 includes a component instance list 322 and a component type list 324. In accordance with the present invention, component type list 324 includes a latency field 326.

Event queue 314 stores a set of chronologically ordered events. Event queue 314 is initialized with status events selected to comprehensively evaluate a circuit's design. A sample initial event queue can take the following form, with the earliest events listed at the right end of the queue.

T60(S2=0); T40(S1=1); T20(S1=0); T0(S2=0); T0(S1=1).

This queue is designed to evaluate circuit 200 as follows: 1) two opposing inputs are introduced at T0 to check if the inverse relationship is properly acknowledged by a low S4; 2) both inputs are changed at the same time T20 to ensure the circuit can recognize inequality through the change; 3) the first input is changed at T40 without changing the second to ensure that the circuit flags this condition; and 4) the second input is changed at T60 later to ensure that the circuit can return to a low indicator.

This event queue includes two events scheduled for execution at time T0. When the simulation time is T0 these events are executed. While in real time they are executed sequentially, in simulation time the executions are concurrent. Signal event T0(S1=1) specifies that the status of signal S1 is to be set at a logic high status at time T0. Signal event T0(S2=0) specifies that at the same time, signal S2 is to be set at a logic low status. Future event T20(S1=0) specifies that S1 will change to a logic low status at T20, which is 20 ns after T0.

Signal list 318 varies in time according to changes in the levels or, more generally, the statuses of signals S1, S2, S3 and S4. After the events scheduled for T0 are executed, signal list 318 takes the form presented in Table 1. Changes are indicated in boldface.

TABLE 1

| SIGNAL LIST FOR CIRCUIT 200 AT T0 | | | | |
|---|---|---|---|---|
| Name | Source | Status | MRT Time | Destinations |
| S1 | INA | 1 | T0 | C1 |
| S2 | INB | 0 | T0 | C1 |
| S3 | C1 | U | T0 | C2 |
| S4 | C2 | U | T0 | OUT |

As is apparent from Table 1, signal list 318 is a database in which the records correspond to signals and the fields are the signal name, the source of the signal, the status of the signal, the time at which the current signal status was most recently attained, and the signal destinations. One or more signal destinations are provided for depending on the fan-out of a signal. The signal name, source and destinations fields do not vary. The status and MRT time fields varied as events in the event queue are processed. The "U" statuses assigned to signals S3 and S4 reflect the fact that no event has set these values directly, and the effects of S1 and S2 on S3 and S4 have not had time to occur as of T0.

Component list 320 for circuit 200 is presented below in Table 2.

TABLE 2

| COMPONENT LIST FOR CIRCUIT 200 | | |
|---|---|---|
| Name (Ci) | C1 | C2 |
| Inputs (Iij) | S1 | S3,S2 |
| Outputs (Qik) | S3 | S4 |
| Function $Q_i = f_k(I_{ik})$ | $I_{11}$ | $I_{21} \oplus I_{22}$ |
| I/O Intervals $T^i_{jk}$ | 2 | 10,12 |
| LATENCIES (Lij) | 0 | 0,4 |

Note that Table 2 is oriented so that records are columns and fields are rows. The records correspond to components C1 and C2. The fields are the component name, its inputs, its outputs, its function, its input-to-output intervals, and its evaluation latencies. The component list does not change over time. Component list 320 provides for plural components, indexed over i, multiple inputs per component, indexed over j, and multiple outputs per component, indexed over k. In addition, component list 320 provides for one function, indexed over i, per component and one I/O interval per output per input per component. Finally, one latency, indexed over i and j, is assigned per input per component.

For components with multiple outputs, the component function provides values for each output. In an alternative embodiment, functions are provided for each output of each component. Note that the functions for circuit 200 list times as well as logical functions to take into account input-to-output delays.

Component list 320 is divided between component instance list 322 and component type list 324 as indicated in Tables 3 and 4.

TABLE 3

| COMPONENT INSTANCE LIST FOR CIRCUIT 200 | | |
|---|---|---|
| Name (Ci) | C1 | C2 |
| Type | Inverter | XOR |
| Inputs (Iij) | S1 | S3,S2 |
| Outputs (Qik) | S3 | S4 |
| LATENCIES (Lij) | D | D |

TABLE 4

| COMPONENT TYPE LIST FOR CIRCUIT 200 | | |
|---|---|---|
| Type | Inverter | XOR |
| Inputs (Iij) | Ii1 | Ii1,Ii2 |
| Outputs (Qik) | Oi1 | Oi1 |
| Function $Q_i = f_k(I_{ik})$ | $\overline{I_{i1}}$ | $I_{i1} \oplus I_{i2}$ |
| I/O Intervals $T^i_{jk}$ | 2 | 10,12 |
| LATENCIES (Lij) | 0 | 0,4 |

Component instance list 322 and component type list 324 can be separated by the introduction of a mediating field, "Type". This separation is particular useful for semi-custom circuits designed using standard cells. Component type list 324 specifies characteristics pertaining to a circuit type. Component instance list 322 relates these characteristics to the overall circuit 200, specifically, by mapping circuit signals to component inputs and outputs.

Conveniently, latencies can be assigned by type as part of a cell design. This approach can be an oversimplification because the ideal latencies can depend on the nature of the signals input to a component. Latencies can be assigned by component instance, but this is less convenient because the circuit designer must analyze the circuit to determine appropriate latencies. Model 316 takes advantage of both approaches, assigning latencies by type, but providing for an overriding of type latencies in a latency field in the component instance list. In Table 3, the default latencies listed in component type list 324 are specified.

The functional blocks of computer 102 differ from a conventional simulation system in that they are adapted to handle the assigned latencies. Memory 304 and, more specifically, component list 320 include the latency assignments. Whereas a conventional queue manager would insert a reevaluation event at the present time, the present invention provides for insertion of evaluation events at simulation times other than the present, for example, after some further signal events. Thus, queue 314 differs from a conventional queue in that evaluation events can be scheduled after future status events. Function evaluator differs from a conventional function evaluator because it adjusts for elapsed latencies in computing outputs from input values.

Figure 4:
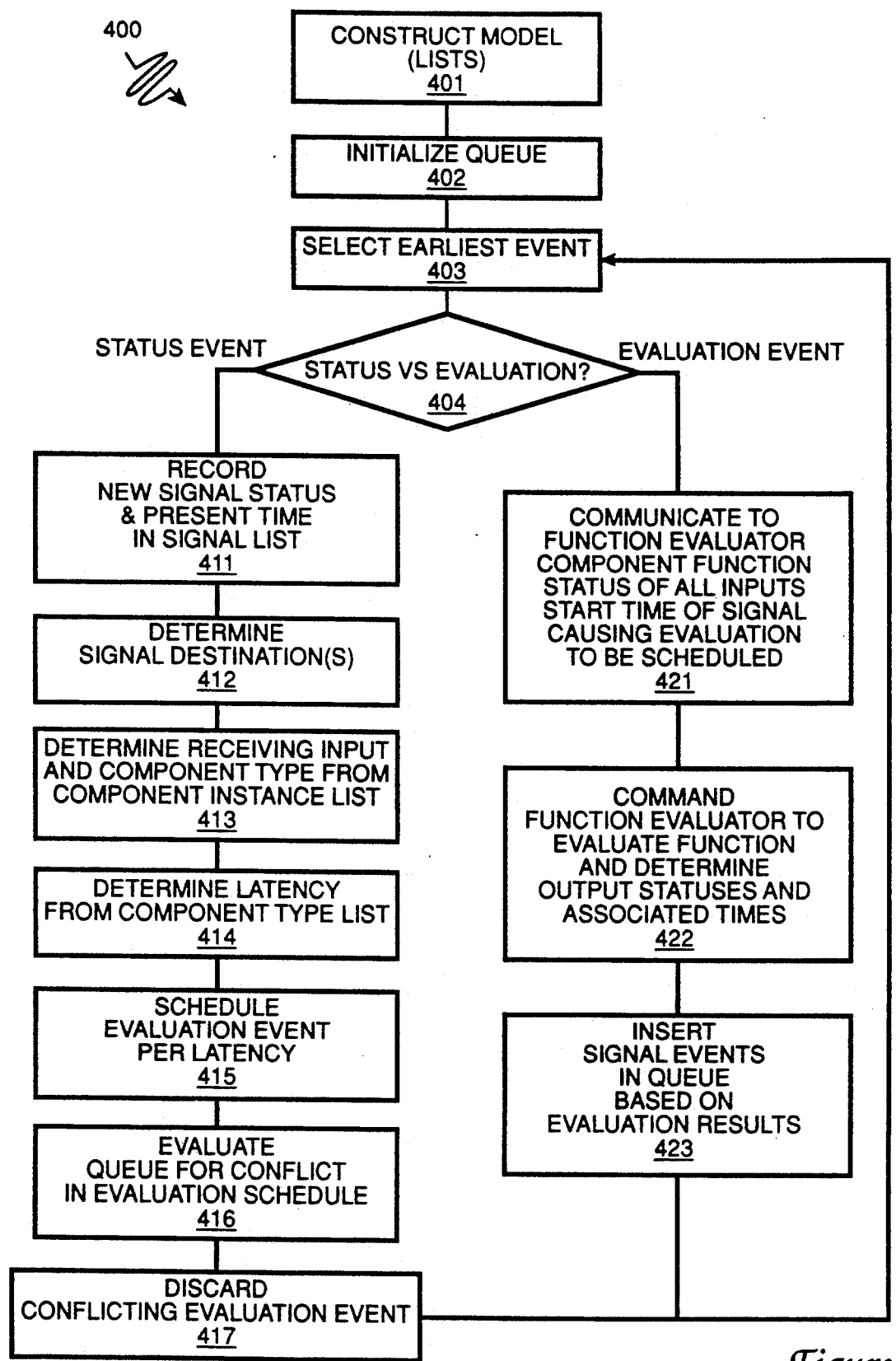
FIG. 4 is a flow chart of a method in accordance with the present invention to be implemented on the system of FIG. 1 to simulate the integrated circuit design of FIG. 2.

The method 400 embodied in and executed by program and microprocessor 302 is illustrated in FIG. 4. Preparatory steps include step 401, that is constructing model 316, i.e., lists 318-324, and step 402, initializing queue 314, as indicated above.

After these preparatory steps, queue manager 312 selects, at step 403, an earliest event for processing. If there is one earliest event, that is selected. If there are two, queue manager 302 must prioritize. In general, status events are selected before evaluation events to maximize the information available for evaluations. Generally, status events can be selected arbitrarily, although an order can be established for a leveled circuit. Treatment of the event depends on whether it is a status event or an evaluation event. This determination is made at step 404.

Event queue 314 is initialized only with status events. When queue manager 312 accepts a status event, such as T0(S1=1) for processing, it accesses signal list 318, and updates the record corresponding to the specified signal (S1) at step 411. Queue manager 312 writes the specified logic value (1) in the status field of the record corresponding to signal S1. T0 is set as the MRT time for this status in the MRT time field of signal S1.

Queue manager 312 then determines which components of circuit 200 serve as destinations for the specified signal, at step 412. The destinations are listed in the destination field of signal list 318. The destination for signal S1 is inverter C1.

This destination serves as an address as queue manager accesses component list 320, or more specifically, component instance list 322, at step 413. At this point, queue manager 312 must determine when and if an evaluation is to be performed. Since default indicators are listed in component instant list, this information must be determined by accessing component type list 324 at step 414. The component type (inverter) determined in the previous step is used to address component type list 324. The latency for input I1 of inverter C1 is given as 0 ns.

Queue manager schedules an evaluation event at step 415. A zero latency requires that the evaluation be scheduled at the present stimulation time. Thus, an evaluation event T0(I11) is scheduled. The notation Tt(Iij) indicates that the effect of the most recent change at the jth input of the ith component is to be evaluated at time Tt. If the latency were positive, the evaluation event would be scheduled for a future time, as indicated further below. If the latency were infinite, as represented by a "very large number", no evaluation would be scheduled. An example of an infinite evaluation is presented with reference to FIG. 5. Note that latency event T0(I11) is scheduled after concurrent status event T0(S2=0); this is consistent with the convention that status events are to be processed before concurrent evaluation events. Event queue 314 now (real time) reads

T60(S2=0); T40(S1=1); T(20=0); T20(S1=0); T0(I11); T0(S2=0).

Steps 416 and 417 concern resolving conflicts between scheduled evaluation events. A conflict occurs whenever queue 314 includes two evaluations events specifying the same component. Obviously, there is no conflict with the first evaluation event T0(I11).

With the completion of processing the event T0(S1=1), processing of T0(S2=0) begins, in accordance with steps 403–417. As a result of this status event, another evaluation event is scheduled. In this case, however, a latency of 4 is associated with the second input of an XOR gate, as indicated in component type list 324. Thus, the evaluation event is scheduled as T4(I22) in this iteration of step 415.

At this point, there are two evaluation events scheduled. They do not conflict because they refer to different components. Therefore, both evaluation events are retained in queue 314, which reads

T60(S2=0); T40(S1=1); T(20=0); T20(S1=0); T4(I22); T0(I11).

The next event is the previously scheduled evaluation event T0(I11). Note that processing an evaluation event does not result in a change in signal list 318. The notation for an evaluation event specifies a component and an input of that component. By referring to component instance list 322, the signal (S1) associated with that input can be determined. This determination serves as an address for signal list, from which the current status of S1 (=1) and the time (T0) that status was most recently attained are recorded, as indicated in Table 1.

Component instance list 322 also specifies the component type so that the function of inverter C1 can be discerned from component type list 324. A logic high, as indicated in signal list 318, can be inserted as the independent variable in the specified inverter function. Thus, a logic low value can be assigned to the output of C1. The interval specified in component type list 324 is 2 ns. This interval is added to the time T0 associated with the last change for signal S1. Thus, the time associated with the new signal event is T2. Component instance list 322 maps the output of inverter C1 to signal S3. Thus, the new signal event is T2(S3=0). Event queue 314 now reads

T60(S2=0); T40(S1=1); T(20=0); T20(S1=0); T4(I22); T2(S3=0).

Processing of all the events assigned to T0 is complete. The earliest time now represented in queue 314 is T2. Thus, T2(S3=0) is the next event selected for processing. This processing results in a revised signal list, as shown in Table 5.

TABLE 5

| Name | SIGNAL LIST FOR CIRCUIT 200 AT T2 | | | |
|---|---|---|---|---|
| | Source | Status | MRT Time | Destinations |
| S1 | INA | 1 | T0 | C1 |
| S2 | INB | 0 | T0 | C2 |
| S3 | C1 | 0 | T2 | C2 |
| S4 | C2 | U | T0 | OUT |

Signal list 318 specifies that XOR gate C2 is the destination for signal S3. Component instance list 322 assigns S3 to input I21. Component type list 324 assigns a 0 ns latency to input Ii1 for XOR gate. Accordingly, evaluation event T2(I21) is scheduled. Queue 318 thus reads

T60(S2=0); T40(S1=1); T(20=0); T20(S1=0); T4(I22); T2(I21).

Events T4(I22) and T2(I21) are concurrently scheduled, albeit for different execution times. They also refer to the same component, XOR gate C2. This is a conflict that must be resolved by queue manager 312. Various strategies are available for resolving this conflict. One can simply elect not to schedule a second evaluation of an already scheduled function. Alternatively, one can discard the previously scheduled evaluation event. Alternatively, one can keep the event dictating the earlier evaluation or the one dictating the later evaluation. Each strategy has its advantages and disadvantages. Queue manager 312 discards the more recently scheduled of conflicting evaluation events, leaving

T60(S2=0); T40(S1=1); T20(S1=0); T20(S2=1); T4(I22).

Model 316 provides for a priority flag (!) in a latency specification where a latency is to take precedence over a previously scheduled evaluation event. Thus, a latency time of 0! would result in an immediate evaluation and the discard of any scheduled evaluation events for the same output.

The processing of the events at T2 is now complete. Queue manager 312 now processes evaluation event T4(I22). Again, signal list 318 does not change in response to an evaluation event. Component type list identifies S2 as the signal that triggered the evaluation being processed. Signal list 318 shows that S2 assumed a logic low status at T0.

Component instance list 322 also shows that S3 is assigned to I21. Signal list 318 shows that the current value for S3 is 0. Inserted these values in the function for an XOR gate, as specified in component type list 324, yields an output of 0. Component type list also assigns interval $T^221=12$ to this result. Component instance list 322 assigns this result to signal S4. Queue manager 312 adds this interval to the present time to specify a new status event T16(S4=0). Queue 314 now reads

T60(S2=0); T40(S1=1); T20(S1=0); T20(S2=1); T16(S4=0).

At T16, status event T16(S4=0) is executed. The signal list becomes as shown in Table 6.

TABLE 6

| SIGNAL LIST FOR CIRCUIT AT T12 | | | | |
|---|---|---|---|---|
| Name | Source | Status | MRT Time | Destinations |
| S1 | INA | 1 | T0 | C1 |
| S2 | INB | 0 | T0 | C2 |
| S3 | C1 | 0 | T2 | C2 |
| S4 | C2 | 0 | T16 | QA |

S4 has no destination, so this status event does not result in an evaluation event. The next event to be processed will be T20(S2=1). The processing of the succeeding events follows the examples set forth above.

The foregoing results, including any intermediate results, can be communicated as desired by an operator or as programmed by having master controller 308 pass information from memory 304 to interface 306 for display on monitor 110.

The foregoing sufficiently illustrates the preferred method of the present invention to discern advantages. The main advantage is that only three of four indicated evaluations were executed. This is a significant savings in the computationally intensive activity of the function evaluator. This advantage can be quite dramatic since each evaluation generates a new event, which in turn can engender a chain reaction of evaluations and events. Evaluations can ripple through a complex circuit. Bypassing one evaluation at a first component can save a multitude of evaluations over an entire circuit.

The other advantage of the present invention is that, additional relevant information may be obtained before the evaluation is executed. Using the prior art approach, I22 would have been evaluated at T0 rather than T4. However, evaluation of the XOR function requires the status of signal S3. The status of S3 is uncertain at T0, so the result of the evaluation is that S4 is uncertain. Of course, there are ways of determining what S3 will be at T2. However, by waiting until T4 to evaluate, the relevant information about S3 is conveniently presented in the signal list.

The advantages provided by the present invention are particularly salient in the context of arithmetic components, such as multipliers. For example, a 16×16 multiplier might have 32 data inputs (X00-X15, Y00-Y15) and a like number of outputs to represent a 32-bit product. The brief output variations that occur as the 32 inputs arrive at slightly different times are not usually of interest, and in fact they are considered undesirable artifacts. Performing simulation evaluations before the inputs all arrive wastes computation time, especially once the cascading effect of the evaluations are taken into account.

The application of the present invention to a multiplier is discussed with reference to a 2×2 multiplier circuit including input registers, a multiplier (component), and output registers. The 2×2 is taken as a simple representation of larger multipliers, such as 4×4, 8×8 and 16×16, etc.

Figure 5:
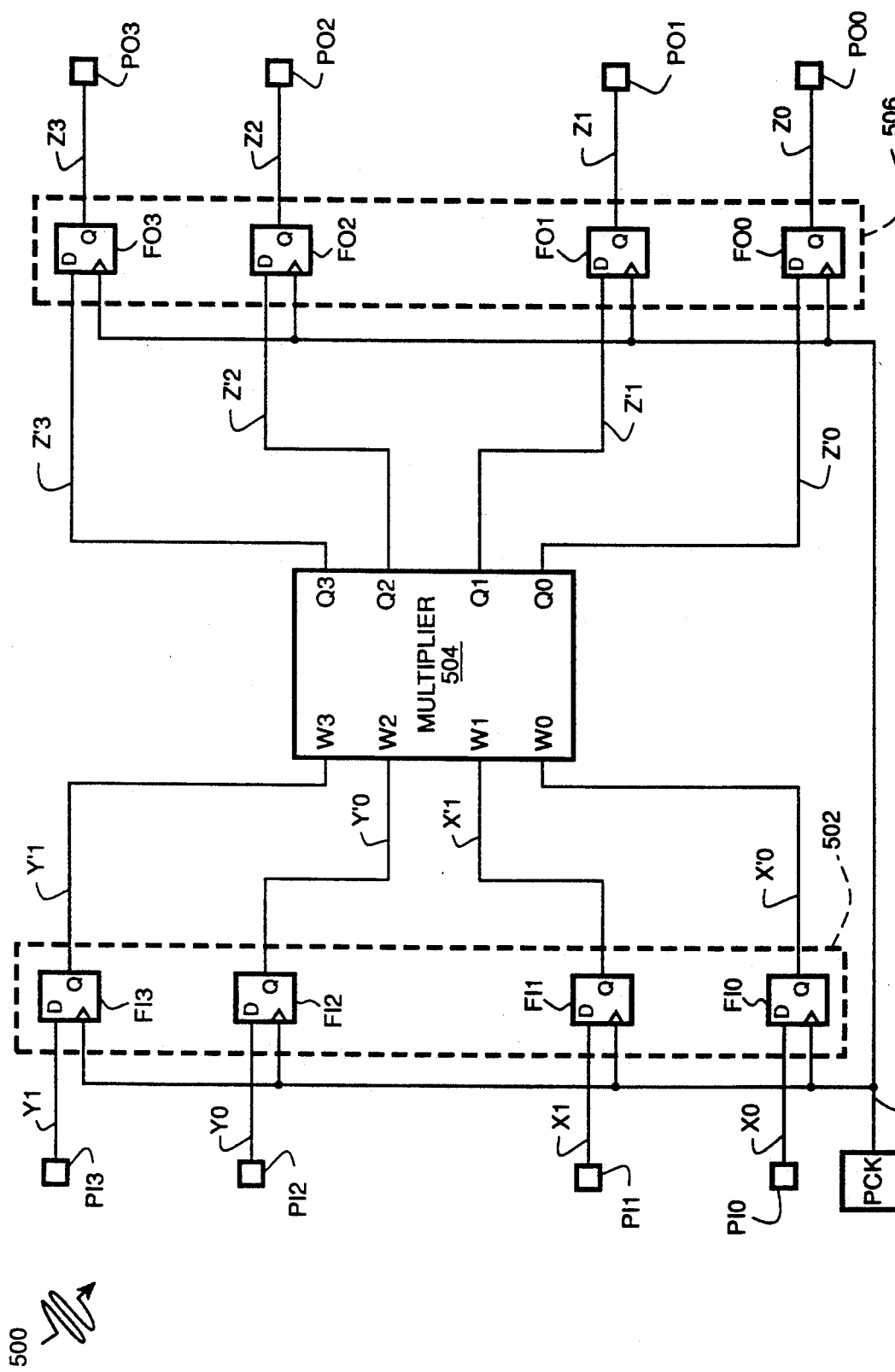
FIG. 5 is a multiplier design which is evaluated using the system of FIG. 1.

Circuit 500 provides a continuous stream of product data in delayed response to data inputs. Circuit 500 includes an input flip-flop bank 502, a multiplier 504, and an output flip-flop bank 506, as shown in FIG. 5. Input flip-flop bank 502 includes four input flip-flops F10-F13, and output flip-flop bank 506 includes four output flip-flops F20-F23. Circuit 500 provides for 17 distinct signals. These include four circuit data input signals X0, X1, Y0, Y1, four multiplier input signals X'0, X'1, Y'0, Y'1, four multiplier output signals Z'0, Z'1, Z'2, Z'3, and four circuit output signals Z0, Z1, Z2, and Z3. In addition, a clock signal CLK is provided that enables and disables the flip-flops during positive-going CLK transitions.

Two 2-bit values are transmitted to circuit 500 via input pins PI0-PI3. These values are encoded as indicated by the labels for input signals X0, X1, Y0 and Y1 which are conveyed from input pins PI0-PI3 to respective input flip-flops F10-F13. The purpose of input flip-flop bank 502 is to synchronize the inputs to multiplier 504. Synchronization minimizes the effect of signal path differences and component timing differences associated with the host system. Output flip-flops F20-F23 perform a comparable function of synchronizing multiplier outputs for the host system, which receive circuit outputs via pins PO0-PO3. The clock signal CLK is received on a ninth pin PCK.

The provision of output flip-flop bank 506 is recognition that the outputs of multiplier 504 are not necessarily synchronized. This is due in part to differential path lengths and subcomponent delays internal to multiplier 504. The lack of synchronization is also due to different path lengths between input flip-flops 502 and multiplier 504. Furthermore, signals X'0, X'1, Y'0 and Y'0 do not leave input flip flop bank 502 at exactly the same time, since a clock transition arrives at the included flip-flops at different times depending on the different path lengths between pin PCK and the clock inputs of the flip-flops.

When CLK is low, the data coming out of the input flip-flops remains constant. Changes in X0, X1, Y0 and Y1 are not reflected in Z0-Z3, since they are not reflected in X'0, X'1, Y'0 and Y'0 nor in Z'0, Z'1, Z12, and Z13. Upon a rising edge of CLK, the values at the D inputs of the input flip-flops are stored therein. The stored value is reflected at the Q outputs of the flip-flops 3 ns after the rising edge of CLK reaches each respective flip-flop clock input. The product output by multiplier 504 stabilizes in response to these input changes in about 30 ns. Thus, CLK must have a period of at least 33 ns for the circuit to function properly. A clock with a period of 50 ns is provided to circuit 500. A next rising edge latches the established product into the output flip-flop bank 506, thus setting data output pins PO0--

PO3 to the new product. At the same time, new input values are latched into input flip-flop bank 502.

Due to length differences between the respective paths between flip-flips FI0-FI3 and clock input pin PCK, changes in X'0, X'1, Y'0 and Y'0 are delayed with respect to each other. Further staggering of transitions can occur due to differences in the signal path lengths between flip-flops FI0-FI3 and respective inputs of multiplier 504. Typically, the staggering of transitions received by multiplier 504 is on the order of 0.5 to 2 ns.

A transition from X,Y=2,1 to X,Y=3,2, i.e., (X1, X0), (Y1, Y0) changes from (1,0), (0,1) to (1,1), (1,0), illustrates the problem caused by this staggering. Input X1 does not change. Due to path length differences, Y0 changes 1 ns after X0 and Y1 changes 2 ns after X0. Thus, the transition occurs in three steps, each of which wakes up the multiplier to calculate a new output. Such a changes are summarized as:

0. (Initial condition) (1,0)×(0,1)=(0,0,1,0)
1. (1,1)×(0,1)=(0,0,1,1)
2. (1,1)×(0,0)=(0,0,0,0)
3. (1,1)×(1,0)=(0,1,1,0)

Here, three input signals changed, causing three evaluations, while only the last output is of interest. By setting a wake-up latency at least as large as the maximum stagger from each data input of multiplier 504, only one evaluation would be required to obtain the output product of interest. The latency should be shorter than the longest internal delay of the multiplier. This ensures that the latency will be shorter than the clock period of any well designed system incorporating the circuit. Thus, the latency cannot result in confusing data from two different clock periods.

In an N+M-bit multiplier, if all N+M inputs change at slightly different times, N+M wake-ups and evaluations would be required for the multiplier itself. Each of these evaluations could engender evaluations for several other components. Using a latency period longer than the spread of the different input delays and shorter than the delay of the multiplier, we lose no accuracy at all, but save up to N−M−1 evaluations. The improvement ratio is N+M:1. In practice, not all inputs change and not all inputs have unique delays. However, an improvement ratio of eight in a 16×16 multiplier is substantial, especially when the savings in fan out evaluations is considered.

During simulation, the foregoing transition can be represented by an entries in a queue:

T0(CLK=1);
T20(X0=0, X1=1, Y0=1, Y1=0).
T25(CLK=0);
T50(CLK=1);
T75(CLK=0);
T100(CLK=1);
T125(CLK=0);
T130(X1=1, Y0=0, Y1=1, CLK=0);
T150(CLK=1);
T175(CLK=0);
T200(CLK=1);

At T100, the signal list will be as presented in Table 7.

TABLE 7

| SIGNAL LIST FOR CIRCUIT 500 AT T100 | | | | |
|---|---|---|---|---|
| Name | Source | Status | MRT Time | Destinations |
| CLK | PCK | 1 | 83 | All FF |
| X0 | PI0 | 0 | T0 | FI0 |
| X1 | PI1 | 1 | T0 | FI1 |

TABLE 7-continued

| SIGNAL LIST FOR CIRCUIT 500 AT T100 | | | | |
|---|---|---|---|---|
| Name | Source | Status | MRT Time | Destinations |
| Y0 | PI2 | 1 | T0 | FI2 |
| Y1 | PI3 | 0 | T0 | FI3 |
| X'0 | FI0 | 0 | T3 | M 504 |
| X'1 | FI1 | 1 | T3 | M 504 |
| Y'0 | FI2 | 1 | T4 | M 504 |
| Y'1 | FI3 | 0 | T5 | M 504 |
| Z'0 | M 504 | 0 | T33 | FO0 |
| Z'1 | M 504 | 1 | T33 | FO1 |
| Z'2 | M 504 | 0 | T34 | FO2 |
| Z'3 | M 504 | 0 | T35 | FO3 |
| Z0 | FO0 | 0 | T38 | PO0 |
| Z1 | FO1 | 1 | T38 | PO1 |
| Z2 | FO2 | 0 | T39 | PO2 |
| Z3 | FO3 | 0 | T40 | PO3 |

T100 is treated as an initial condition in this description. T125 does not induce any changes. Accordingly, the first transition to be analyzed occurs at T130. The revised signal list is shown in Table 8.

TABLE 8

| SIGNAL LIST FOR CIRCUIT 500 AT T130 | | | | |
|---|---|---|---|---|
| Name | Source | Status | MRT Time | Destinations |
| CLK | PCK | 0 | 125 | All FF |
| X0 | PI0 | 1 | T130 | FI0 |
| X1 | PI1 | 1 | T0 | FI1 |
| Y0 | PI2 | 0 | T130 | FI2 |
| Y1 | PI3 | 1 | T130 | FI3 |
| X'0 | FI0 | 0 | T3 | M 504 |
| X'1 | FI1 | 1 | T3 | M 504 |
| Y'0 | FI2 | 1 | T4 | M 504 |
| Y'1 | FI3 | 0 | T5 | M 504 |
| Z'0 | M 504 | 0 | T33 | FO0 |
| Z'1 | M 504 | 1 | T33 | FO1 |
| Z'2 | M 504 | 0 | T34 | FO2 |
| Z'3 | M 504 | 0 | T35 | FO3 |
| Z0 | FO0 | 0 | T38 | PO0 |
| Z1 | FO1 | 1 | T38 | PO1 |
| Z2 | FO2 | 0 | T39 | PO2 |
| Z3 | FO3 | 0 | T40 | PO3 |

The queue manager looks to the component list for the characteristics of destinations FI0, FI12, and FI3. The model for circuit 500 separates the component list into a component instant list and a component type list, presented below as Tables 9 and 10 respectively, with the former making reference to the latter.

TABLE 9

| COMPONENT INSTANCE LIST FOR CIRCUIT 500 | | | |
|---|---|---|---|
| Name ($C_i$) | Type | Inputs ($I_{i,j}$) | Outputs ($Q_{i,k}$) |
| M 504 | Multiplier | X'0, X'1, Y'0, Y'1 | Z'0, Z'1, Z'2, Z'3 |
| FI0 | Flip-Flop | X0, CLK | X'0 |
| FI1 | Flip-Flop | X1, CLK | X'1 |
| FI2 | Flip-Flop | Y0, CLK | Y'0 |
| FI3 | Flip-Flop | Y1, CLK | Y'1 |
| FO0 | Flip-Flop | Z'0, CLK | Z0 |
| FO1 | Flip-Flop | Z'1, CLK | Z1 |
| FO2 | Flip-Flop | Z'2, CLK | Z2 |
| FO3 | Flip-Flop | Z'3, CLK | Z3 |

Component functions and latencies are determined by looking in the respective rows for the appropriate component type as indicated in Table 10.

TABLE 10

| COMPONENT TYPE LIST FOR CIRCUIT 500 | | |
|---|---|---|
| Type Name | Multiplier | Flip-Flop |
| Functions | $Z_0 = X_0 \cdot Y_0$ | Q = D at last rising CLK |
| $Q_k = f_k(I_{i,k}, l_{i,k,t})$ | $Z_1 = (X_1 \pm Y_1) \cdot (X_0 + Y_0) \cdot (W)$ | |

TABLE 10-continued

| COMPONENT TYPE LIST FOR CIRCUIT 500 | | |
|---|---|---|
| Type Name | Multiplier | Flip-Flop |
| (W =X0·X1·Y0·Y1) | Z2 =(X1·Y1)·($\overline{W}$) | |
| | Z3 = W | |
| I/O Intervals | 30,30,30,30 | 3 |
| LATENCIES (Lij) | 2,2,2,2 | ∞,0 |

As is apparent from Tables 9 and 10, splitting the component list into a component instance list and a component type list can save considerable memory space and simply evaluations. Rather than repeating the flip-flop function eight times in an integrated component list, the flip-flop function can be described once in the component type list.

The latencies are equal for all four inputs of multiplier 504. The 2 ns is selected to equal the maximum input signal stagger, as described above. The latencies for the flip flop are infinity for the D input and zero for the clock input. An infinite latency corresponds to an instruction never to evaluate in response to a change at the D input of a flip-flop. The zero latency corresponds to an instruction to evaluate the flip flop output immediately when a rising clock transition is detected.

At T150, CLK undergoes a rising transition which is immediately detected at FI0, FI1 and FO0, FO1. As indicated by the component type list, an immediate evaluation is required for these flip-flops. Only FI0 has a changed data input, so its output is revised to a new level. This change is reflected in row X'0 below. This transition in X'0 actually occurs at T153, due to the 3 ns flip-flop delay. During the next two nanoseconds, Y'0 and Y'1 change as indicated below. By T155, changes at the flip-flop inputs are reflected at the outputs. In this case, changes in the last 5 ns are boldfaced in Table 11.

TABLE 11

| SIGNAL LIST FOR CIRCUIT 500 AT T155 | | | | |
|---|---|---|---|---|
| Name | Source | Status | MRT Time | Destinations |
| CLK | PCK | 1 | 150 | All FF |
| X0 | PI0 | 1 | T130 | FI0 |
| X1 | PI1 | 1 | T0 | FI1 |
| Y0 | PI2 | 0 | T130 | FI2 |
| Y1 | PI3 | 1 | T130 | FI3 |
| X'0 | FI0 | 1 | T153 | M 504 |
| X'1 | FI1 | 1 | T3 | M 504 |
| Y'0 | FI2 | 0 | T154 | M 504 |
| Y'1 | FI3 | 1 | T155 | M 504 |
| Z'0 | M 504 | 0 | T33 | FO0 |
| Z'1 | M 504 | 1 | T33 | FO1 |
| Z'2 | M 504 | 0 | T34 | FO2 |
| Z'3 | M 504 | 0 | T35 | FO3 |
| Z0 | FO0 | 0 | T38 | PO0 |
| Z1 | FO1 | 1 | T38 | PO1 |
| Z2 | FO2 | 0 | T39 | PO2 |
| Z3 | FO3 | 0 | T40 | PO3 |

By T185, CLK has gone low and the outputs of the multiplier have changed. At T200, clock CLK rises again permitting the multiplier output values to be entered into the output flip-flops. This process is completed by T205. All signal values changed from Table 9 are shown in boldface. Only Z'2 changes from its original value. The changes follow the multiplier functions in the component type list. The signal list at T205 is as shown in Table 12.

TABLE 12

| SIGNAL LIST FOR CIRCUIT 500 AT T205 | | | | |
|---|---|---|---|---|
| Name | Source | Status | MRT Time | Destinations |
| CLK | PCK | 1 | 200 | All FF |
| X0 | PI0 | 1 | T130 | FI0 |
| X1 | PI1 | 1 | T0 | FI1 |
| Y0 | PI2 | 0 | T130 | FI2 |
| Y1 | PI3 | 1 | T130 | FI3 |
| X'0 | FI0 | 1 | T153 | M 504 |
| X'1 | FI1 | 1 | T3 | M 504 |
| Y'0 | FI2 | 0 | T154 | M 504 |
| Y'1 | FI3 | 1 | T155 | M 504 |
| Z'0 | M 504 | 0 | T33 | FO0 |
| Z'1 | M 504 | 1 | T33 | FO1 |
| Z'2 | M 504 | 1 | T185 | FO2 |
| Z'3 | M 504 | 0 | T35 | FO3 |
| Z0 | FO0 | 0 | T38 | PO0 |
| Z1 | FO1 | 1 | T38 | PO1 |
| Z2 | FO2 | 1 | T204 | PO2 |
| Z3 | FO3 | 0 | T40 | PO3 |

At T200 clock CLK rises again, so by T205, Z2 changes to reflect the earlier change in Z'2. This completes the multiplication.

The present invention applies to a variety of circuit types, including non-integrated electrical circuits, computer subsystems, optical circuits, neural networks, and other circuits where logical functions and timing considerations are combined. These and other modifications to and variations upon the preferred embodiments are provided for by the present invention, the scope of which is limited only by the following claims.

What is claimed is:

1. A method of simulating an integrated circuit, said method comprising:
    constructing a model of said circuit, said model including at least one component having an output and plural inputs, said constructing involving
        associating respective input statuses to respective ones of said plural inputs and associating an output status with said output; and
        assigning to said component a function according to which said output status at a given time can be calculated from said input statuses;
    selecting for processing a first status event specifying that a first input of said inputs is to change at the present time to a specified new status;
    recording the new status so that it can be associated with said first input; and
    scheduling a first evaluation event specifying that said function is to be evaluated at a future simulation time given said new status.

2. A method as recited in claim 1 wherein:
    when a second status event occurring at a simulation time before said first evaluation event calls for a second evaluation event for evaluating said function, purging one of said first and second evaluation events without processing said function in accordance therewith;
    whereby, superfluous evaluations are reduced.

3. A method as recited in claim 2 wherein the evaluation event that would result in the later-scheduled evaluation is purged in favor of an evaluation event would result in an earlier evaluation.

4. A method as recited in claim 1 wherein:
    when a second status event occurring at a simulation time before said first evaluation event calls for a second evaluation event for evaluating said function, purging said first evaluation event without processing it and scheduling said second evaluation event.

5. A method as recited in claim 1 wherein:

when a second status event occurring at a simulation time before said first evaluation event calls for a second evaluation event for evaluating said function, purging said second evaluation event while retaining the scheduling of said first evaluation.

6. A method of simulating an integrated circuit comprising:

selecting a first status event from an event queue, said first status event specifying that a first signal is to change to a first status at the present simulation time;

recording said first status in association with said first signal;

identifying a first input of a component arranged to receive said first signal;

identifying a first positive finite evaluation latency associated with said first input;

scheduling a first evaluation event at a future simulation time equal to the present time plus said first evaluation latency;

if and when said first evaluation event becomes a present event, selecting it for processing, said processing including computing an output status and an associated output-status time for an output status and an associated output-status function of said component given sand first status of said first signal; and scheduling a second status event specifying that a signal having said output as its source is to change to the computed output status at the computed output-status time.

7. A method as recited in claim 6 wherein:

when a second status event occurring at a simulation time before said first evaluation event calls for a second evaluation event for evaluating said function, purging one of said first and second events without processing said function in accordance therewith;

whereby, superfluous evaluations are reduced.

8. An event-driven circuit simulator comprising:

storage means for storing data characterizing said circuit and for storing data specifying events affecting said circuit, said storage means including component means for characterizing a component of said circuit, said first component having an output characterizable by an output status, said component having plural inputs, said inputs being characterized by respective input statuses and respective input-to-output durations, said plural inputs including a first input having a first input status, said component means specifying a function of said component that permits said output status to be computed from said input statuses, said component means specifying evaluation latency times for at least some of said inputs, said component means specifying a positive finite latency time for said first input;

status means for storing data permitting determination of the status of each input, queue means for selectively storing events, said events including status events that specify that a specified input is to change to a specified status at a specified simulation time, said status events including present status events for execution at the present simulation time and future status events for execution at a future simulation time, and evaluation events that specify when said function is to be evaluated, said evaluation events including present evaluation events for execution at the present simulation time and future evaluation events for execution at a future simulation time, and program means for simulating operation of said circuit, said program means including evaluation means for evaluating said function, said evaluation means being coupled to said component means for determining said function; and manager means for processing said events, said manager means being coupled to said queue means for selecting a present event for processing and for scheduling new events, said manager means being coupled to said evaluation means for causing said function to be evaluated as specified by a present evaluation event, said manager means being coupled to said status means for modifying the data stored thereby to record a new signal status specified by a present status event, said manager means being coupled to said component means for determining the latency associated with the input specified by a present status event for scheduling an evaluation event at a simulation time equal to the present time plus the specified latency;

whereby, in response to a first status event specifying a change in said first input status, said manager means schedules a first future evaluation event in said queue means at a simulation time equal to the simulation time specified by said first status event plus said positive finite latency time.

9. A simulator as recited in claim 8 wherein:

said manager means includes evaluation conflict resolving means for selectively processing exactly one of a plurality of said evaluation events stored by said queue means and concurrently scheduled for different simulation times.

* * * * *